United States Patent [19]

Terakado et al.

[11] Patent Number: 5,123,585
[45] Date of Patent: Jun. 23, 1992

[54] WIRE BONDING METHOD

[75] Inventors: Yoshimitsu Terakado; Shinichi Kumazawa; Nobuto Yamazaki, all of Tokyo, Japan

[73] Assignee: Kabushiki Kaisha Shinkawa, Tokyo, Japan

[21] Appl. No.: 534,145

[22] Filed: Jun. 6, 1990

[30] Foreign Application Priority Data

Jun. 7, 1989 [JP] Japan .................................. 1-143042

[51] Int. Cl.$^5$ ........................................... H01L 21/60
[52] U.S. Cl. ..................................... 228/102; 228/179
[58] Field of Search .................... 228/102, 179, 4.5, 9, 228/10

[56] References Cited

U.S. PATENT DOCUMENTS

| 4,266,710 | 5/1981 | Bilane et al. | 228/4.5 |
| 4,444,349 | 4/1984 | Bilane et al. | 228/102 |
| 4,789,095 | 12/1988 | Kobayashi | 228/179 |
| 4,855,928 | 8/1989 | Yamanaka | 228/4.5 |

Primary Examiner—Samuel M. Heinrich
Attorney, Agent, or Firm—Koda and Androlia

[57] ABSTRACT

A wire bonding method in which a bonding tool is lowered fast toward a bonding surface and the lowering speed of the bonding tool is then reduced at a speed-change point near the bonding surface, wherein a bonding level at which the bonding tool contacts with the bonding surface is detected and stored in a memory, and the following speed-change points of the lowering motion of the bonding tool are automatically determined in accordance with the previously detected bonding level.

1 Claim, 4 Drawing Sheets

WIRE BONDING METHOD

BACKGROUND OF THE INVENTION

1. Field of the Invention

The present invention relates to a wire bonding method which uses a bonding apparatus for assembling semiconductor integrated circuits, etc.

2. Prior Art

In bonding apparatuses, bonding action is performed by (a) first actuating a bonding arm provided with a bonding tool through which a wire is passed, so that the bonding tool is lowered at a rapid speed toward the bonding surface of a sample, and then (b) changing the speed at a speed-change point which is sufficiently close to the bonding surface, so that the bonding tool presses against the bonding surface while being lowered at a slower speed.

Conventionally, the speed-change point in the lowering motion of the bonding tool is positioned at a preset position.

Meanwhile, methods for detecting the bonding surface are disclosed, for example, in Japanese Patent Application Laid-Open (Kokai) No. 55-244 (hereinafter called "Conventional Method 1"), in Japanese Patent Application Publication (Kokoku) No. 64-9730 (called "Conventional Method 2"), and in Japanese Patent Application Publication (Kokoku) No. 64-811 ("Conventional Method 3").

As shown in FIG. 4, in Conventional Method 1, a lead frame 2 to which a pellet 1 adheres is guided and moved onto a sample-carrying table 3. A bonding arm 6 which holds a bonding tool 5 through which a wire 4 is passed is provided so as to pivot on an elevator table 7. This elevator table 7 is guided and supported so that it can move vertically on a base 9 which is installed on an X-Y table 8. The elevator table 7 is moved up and down by a feeder means which comprises a feed screw 10 supported on the base 9, a Z-axis motor which rotates the feed screw 10 and an encoder 12 which is installed on the rear end of the Z-axis motor 11.

The wire 4 is alternately bonded to the bonding surfaces of the pellet 1 and lead frame 2 by a combination of a vertical movement of the bonding tool 5 caused by the Z-axis motor 11 and an X-Y movement of the bonding tool 5 effected by the X-Y table 8.

Contacts 14 and 15 are respectively installed on the elevator table 7 and on a holder 13 which is shaft-supported together with the bonding arm 6 (the contacts 14 and 15 face each other). When the bonding tool 5 is lowered so that it is pressed against the bonding surface, the bonding arm 6 pivots by a very small angle so that the contacts 14 and 15 are separated from each other. As a result, the timing of the bonding tool contacting with the bonding surface is known.

In the above methods, the position of the speed-change point is set at a height which allows sufficient tolerance with respect to fluctuations in the height of the bonding surface caused by variations between samples and inclination of the sample surfaces. As a result, the time required for the bonding tool 5 to actually contact with the bonding surface (when the tool bonding 5 is lowered) can be not longer than necessary, resulting in that the efficiency of the bonding operation is decreased.

On the other hand, if the speed-change point is set too low, the bonding conditions (bonding load, tool lowering speed, etc.) will become unstable in cases where the bonding surface is higher than the expected position, etc. Such instability causes defective units.

SUMMARY OF THE INVENTION

Accordingly, the object of the present invention is to provide a wire bonding method in which the working efficiency of the bonding operation is improved, and in which the bonding conditions are stable so that bondability is improved.

The object of the present invention is accomplished by a method in which a bonding arm (which is provided with a bonding tool through which a wire is passed) is actuated so that the bonding tool is lowered at a rapid speed toward the bonding surface of a sample, (b) the lowering speed of the bonding tool is reduced at a speed-change point near the bonding surface so that the bonding tool is caused to press against the bonding surface at a slower speed, wherein the method includes the steps of (1) detecting and storing in a memory the bonding level at which the bonding tool contacts the bonding surface, and (2) performing bonding as the speed-change point (of the lowering motion of the bonding tool) is automatically determined in accordance with the previous bonding for the same sample.

The speed change points are determined for the initial bonding points (first wire) in the same manner as in conventional methods, and the bonding tool is lowered rapidly to the speedchange points. From this point, the bonding tool is lowered slowly to perform bonding. The actual bonding levels in this case are detected and stored in a memory.

Then, for the remaining bonding points, (second wire on), the speed-change points are determined in accordance with the bonding levels at the previous bonding points. In each case, the bonding tool is rapidly lowered to the speed-change points, then the bonding tool is slowly lowered from the speed-change points, so that bonding is performed. The actual bonding levels in each case are stored in a memory, and such operation is repeated.

Thus, for each sample, the actual bonding levels are detected, and the speed-change points of the lowering motion of the bonding tool are automatically altered in accordance with the bonding levels. Accordingly, the slow-speed lowering time of the bonding tool can be shorter than it actually is necessary, and the working efficiency of the bonding operation can be improved. In addition, the bonding conditions can be stable, and bondability is also improved.

DETAILED DESCRIPTION OF THE INVENTION

Figure 1:
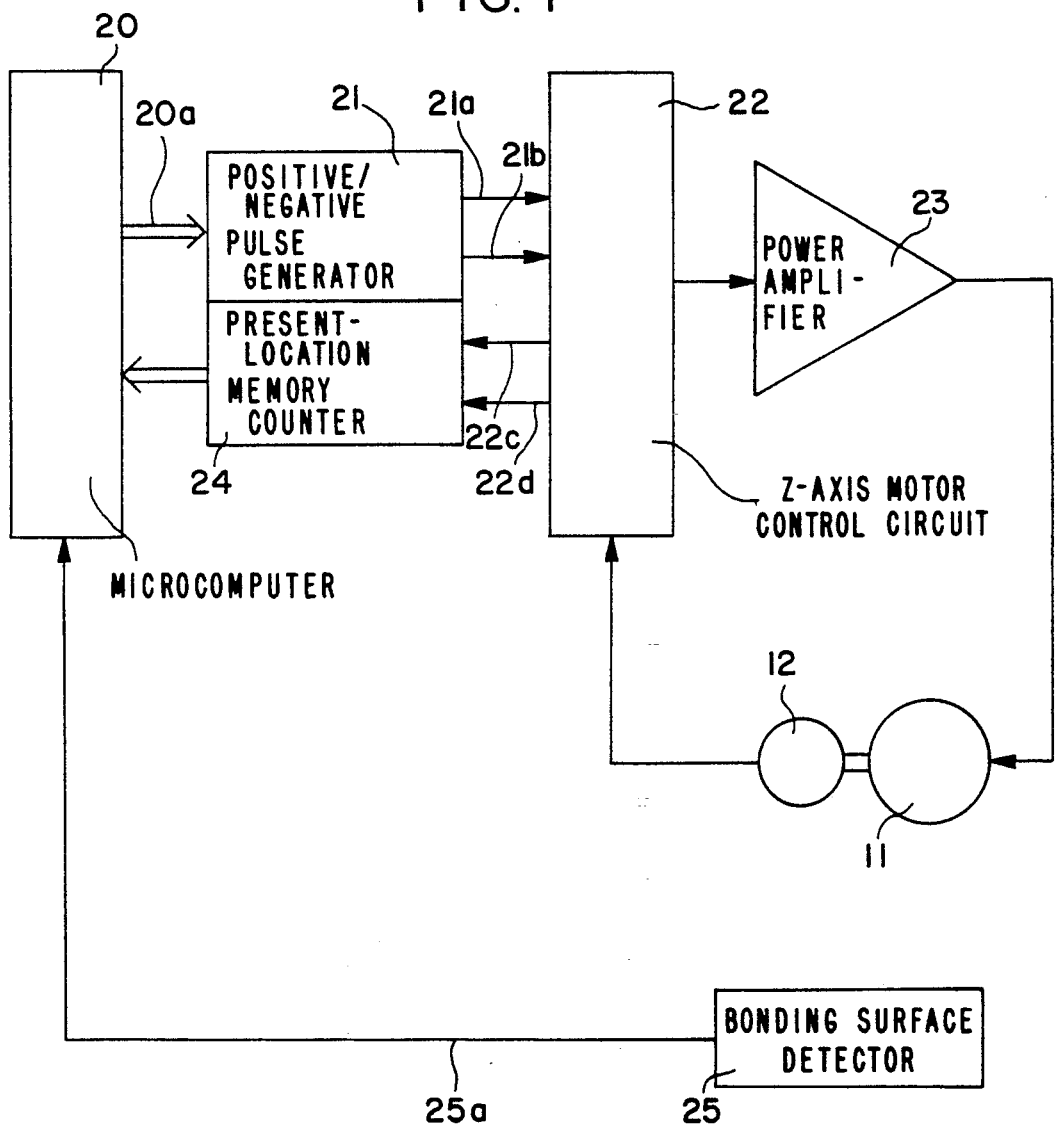
FIG. 1 is a block diagram illustrating one embodiment of the control device used in a wire bonding method of the present invention.

One embodiment of the present invention will be described below with reference to FIGS. 1 through 3:

As shown is FIG. 1, when control signals 20a are output to a positive/negative pulse generator 21 from a microcomputer 20 which controls the bonding apparatus, forward-rotation driving pulses 21a and reverse-rotation driving pulses 21b are output from the positive/negative pulse generator 21, and a Z-axis motor 11 is driven via a motor control circuit 22 and a power amplifier 23. Thus, bonding tool 5 is moved up and down.

The output of an encoder 12 which detects the rotational position of the Z-axis motor 11, i.e., the vertical position of the bonding tool 5, is input into motor control circuit 22. Forward-rotation pulses 22c and reverse-rotation pulses 22d are output from the motor control circuit 22 and stored in a present-location memory counter 24.

Bonding surface detection signals 25a, which are generated by a bonding surface detector 25 (made up with contacts 14 and 15) which detects the fact that the bonding tool 5 has contacted the bonding surface, are input into the microcomputer 20. The count value of the present-location memory counter 24, which occurs at the time that such a bonding surface detection signal 25a is input, is read out of the microcomputer 20 so that the bonding level is ascertained.

Figure 2:
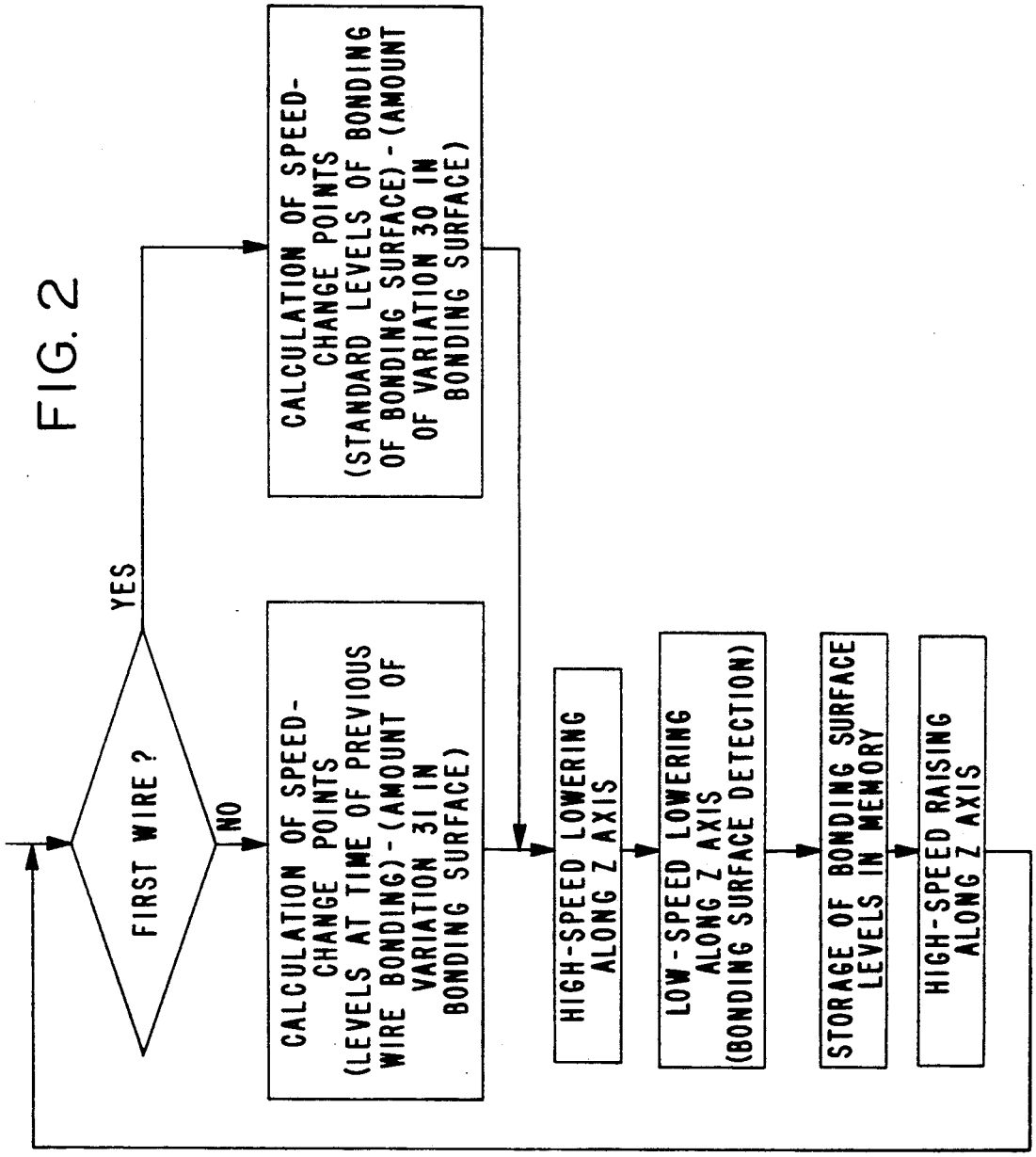
FIG. 2 is a flow chart of the wire bonding method of the present invention.

FIG. 2 illustrates the wire bonding steps of the present invention.

Figure 3:
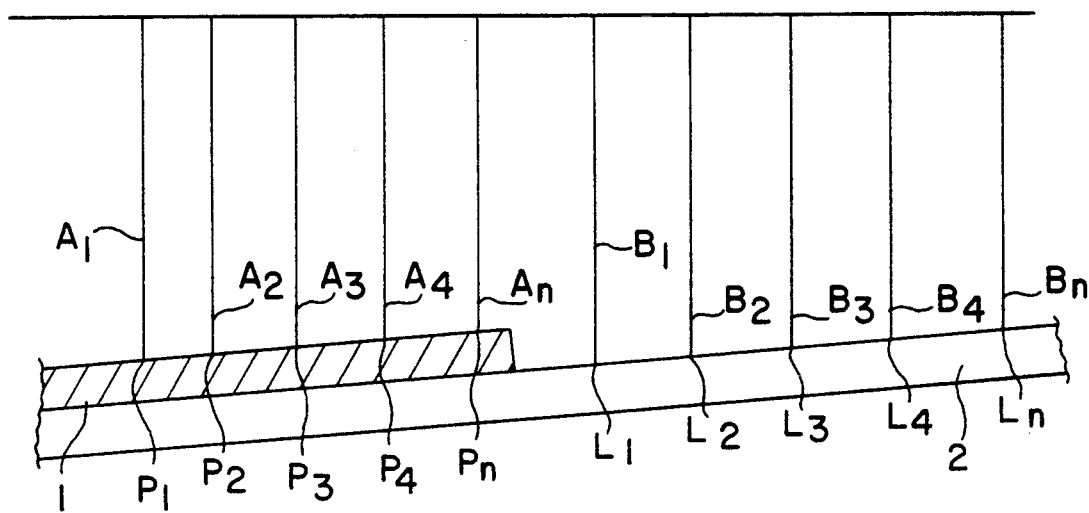
FIG. 3 is an explanatory diagram of the operation of the method of FIG. 2.
Figure 4:
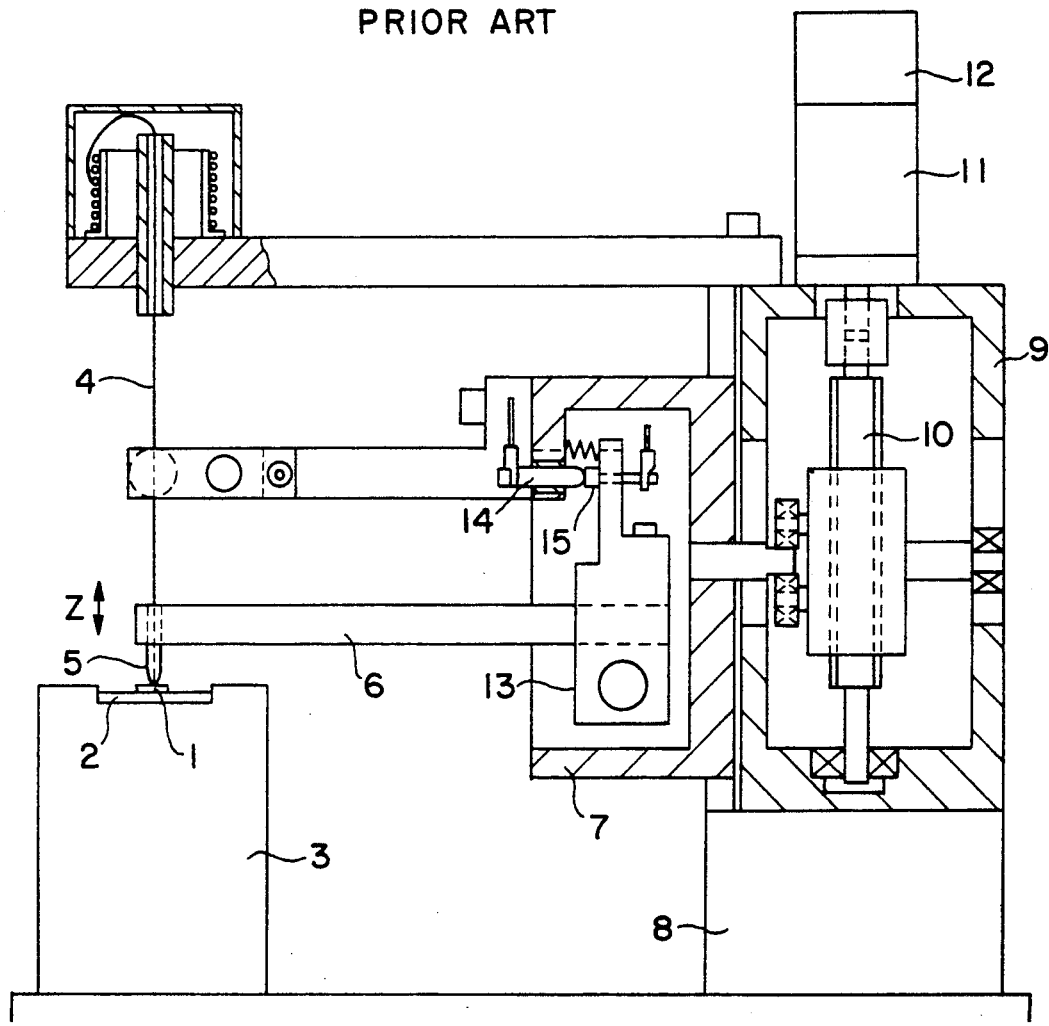
FIG. 4 is a partial cross section of conventional bonding apparatus.

In FIG. 2, the bonding points $P_n$ (n=1, 2, ... n) on the pellet 1 and the bonding points $L_n$ (n=1, 2, ...n) on the lead frame 2, shown in FIG. 3, are alternately connected with the wire 4. In this case, when the initial bonding points Pl and Ll (first wire) are bonded, the speed change points $A_1$ and $B_1$ are determined by subtracting the value of the amount of variation (30) in the bonding surface from the value fixed as a standard level for the bonding surface (as in the same manner as in conventional methods). The "amount of variation" in the above is an amount which allows sufficient tolerance with respect to fluctuations in the height of the bonding surface caused by variation between the sample and inclination of the sample surfaces. The values $A_1$ and $B_1$ described above are stored beforehand in the microcomputer 20.

Then, the Z-axis motor 11 is driven by the control signal 20 of the microcomputer 20. As a result, the bonding tool 5 is lowered rapidly to the speed-change point $A_1$, which is for the bonding point $P_1$ on the pellet 1, and to the speed-change point $B_1$, which is for the bonding point $L_1$ on the lead frame 2. From these speed-change points, the bonding tool 5 is then lowered slowly so that bonding is performed at the bonding points $P_1$ and $L_1$. At the same time, the actual bonding levels are stored as a result of the microcomputer 20 reading the count values of the present-location memory counter 24 in accordance with bonding surface detection signals 25a from the bonding surface detector 25.

Then, for the subsequent bonding points $P_2$, $L_2$,... (second wire on), the speed-change points $A_2$, $B_2$, ... which are determined by the microcomputer 20 by subtracting the value of a predetermined amount of variation (31) in the bonding surface (an amount which takes into account the amount of variation arising from inclination of the sample, etc.) from the bonding levels at the previous bonding points. The bonding tool 5 is rapidly lowered to these speed-change points, and then from these points, the bonding tool 5 is slowly lowered and bonding is performed. At the same time, these actual bonding levels are stored, and such operation is repeated.

In the embodiment above, the bonding levels are detected by the method of Conventional Method 1; however, it would be possible to perform this detection by Conventional Method 2 or 3.

As is clear from the above description, in the present invention, the actual bonding levels are detected for each sample, and the speed-change points of the lowering motion of the bonding tool are automatically altered in accordance with such bonding levels. Accordingly, it is not necessary to set the slow-speed lowering time of the bonding tool to be longer than necessary, and the working efficiency can be improved. At the same time, the bonding conditions can be stable, and bondability can be improved too.

We claim:

1. A wire bonding method wherein a bonding arm which holds a bonding tool through which wire is passed is actuated and lowered at a rapid speed toward a bonding surface of a sample, the lowering speed of said bonding tool is changed at a speed-change point near said bonding surface so that said bonding tool is lowered at a slower speed and caused to press against said bonding surface to perform bonding, said method further comprising the steps of:
    (a) setting a predetermined level for said bonding surface;
    (b) subtracting a predetermined variation value from said predetermined level to calculate a first speed-change point;
    (c) performing bonding on and measuring an actual level for said bonding surface of a first bonding point based upon said first speed change point;
    (d) subtracting said predetermined variation value from said actual level measured at a previous bonding point to calculate another speed-change point;
    (e) moving to another bonding point;
    (f) performing bonding on and measuring an actual level of said bonding surface for said another bonding point based upon said another speed-change point; and
    (g) repeating steps (d) through (f) until wire bonding of all bonding points is completed;
    whereby the speed change point is automatically determined in accordance with the level of the bonding surface measured at the previous bonding point.

* * * * *